United States Patent
Kubo et al.

(10) Patent No.: US 7,397,128 B2
(45) Date of Patent: Jul. 8, 2008

(54) SEMICONDUCTOR DEVICE AND METHOD OF MANUFACTURING THE SAME

(75) Inventors: Hirotoshi Kubo, Gunma (JP); Yukari Shirahata, Aichi (JP); Shigehito Matsumoto, Saitama (JP); Masamichi Yamamuro, Tochigi (JP); Koujiro Kameyama, Gunma (JP); Mitsuo Umemoto, Gunma (JP)

(73) Assignees: Sanyo Electric Co., Ltd., Moriguchi-shi, Osaka (JP); Kanto Sanyo Semiconductors Co., Ltd., Ora-gun, Gunma (JP)

( * ) Notice: Subject to any disclaimer, the term of this patent is extended or adjusted under 35 U.S.C. 154(b) by 0 days.

(21) Appl. No.: 11/392,802

(22) Filed: Mar. 28, 2006

(65) Prior Publication Data

US 2006/0220178 A1  Oct. 5, 2006

(30) Foreign Application Priority Data

Mar. 30, 2005 (JP) ............... P2005-097602
Aug. 31, 2005 (JP) ............... P2005-252184

(51) Int. Cl.
*H01L 23/48* (2006.01)

(52) U.S. Cl. .............. 257/774; 257/773; 257/510; 257/698

(58) Field of Classification Search ............. 257/734, 257/621, 773, 777, 666, 667, 774, 775; 438/666, 438/149–164

See application file for complete search history.

(56) References Cited

U.S. PATENT DOCUMENTS

| | | | | |
|---|---|---|---|---|
| 5,716,868 A | * | 2/1998 | Nagai | 438/430 |
| 6,462,419 B1 | * | 10/2002 | Asai | 257/774 |
| 6,790,775 B2 | * | 9/2004 | Fartash | 438/667 |
| 6,847,275 B2 | * | 1/2005 | Sayanagi et al. | 333/247 |
| 6,972,218 B2 | * | 12/2005 | Kishiro | 438/149 |
| 2004/0061133 A1 | * | 4/2004 | Hayasi | 257/197 |
| 2005/0082607 A1 | * | 4/2005 | Nakamura et al. | 257/330 |
| 2005/0127478 A1 | * | 6/2005 | Hiatt et al. | 257/621 |
| 2005/0127831 A1 | * | 6/2005 | Takeuchi et al. | 313/506 |
| 2006/0038300 A1 | * | 2/2006 | Tanida et al. | 257/773 |
| 2006/0231936 A1 | * | 10/2006 | Matsuda | 257/678 |

FOREIGN PATENT DOCUMENTS

JP   2004-102345   4/2004

OTHER PUBLICATIONS

Drury, Bill. Control Techniques Drives and Controls Handbook. London, UK: The Institution of Electrical Engineers, 2001.*

* cited by examiner

*Primary Examiner*—Zandra Smith
*Assistant Examiner*—Paul E Patton
(74) *Attorney, Agent, or Firm*—Fish & Richardson P.C.

(57) ABSTRACT

Disclosed is a semiconductor device in which emitter pad electrodes connected to an active region, collector and base pad electrodes are formed on a surface of a semiconductor substrate. Furthermore, on a back surface of the semiconductor substrate, a backside electrode is formed. Moreover, the emitter pad electrodes connected to a grounding potential are connected to the backside electrode through feedthrough electrodes penetrating the semiconductor substrate in a thickness direction.

5 Claims, 13 Drawing Sheets

US 7,397,128 B2

SEMICONDUCTOR DEVICE AND METHOD OF MANUFACTURING THE SAME

Priority is claimed to Japanese Patent Application Number JP2005-097602 filed on Mar. 30, 2005 and JP2005-252184 filed on Aug. 31, 2005, the disclosure of which is incorporated herein by reference in its entirety.

BACKGROUND OF THE INVENTION

1. Field of the Invention

The present invention relates to a semiconductor device and a method of manufacturing the same. In particular, the present invention relates to a semiconductor device including feedthrough electrodes penetrating a semiconductor substrate, and a method of manufacturing the same.

2. Description of the Related Art

Referring to a perspective view of FIG. 13, a description will be given of a circuit device 100 in which a conventional semiconductor device 105 is incorporated. This technology is described for instance in Japanese Patent Application Publication No. 2004-102345.

The circuit device 100 has a structure in which the semiconductor device 105 is mounted on a surface of a land 112 placed in a center portion. From both ends of the land 112, leads 101B and 101D are led to an outside. Furthermore, leads 101A and 101C are located at both sides of the land 112. Moreover, the entire circuit device 100 is covered with a sealing resin 104.

The semiconductor device 105 is a bipolar transistor here, and emitter, collector, and base electrodes are formed on a surface thereof. The collector and the base electrodes formed on the surface of the semiconductor device 105 are connected to the leads 101C and 101A through thin metal wires 103. In addition, the emitter electrodes of the semiconductor device 105 are connected to the land 112 through the thin metal wires 103. Here, the two emitter electrodes formed on the surface of the semiconductor device 105 are connected to the land 112 through the thin metal wires 103. Moreover, the emitter electrodes are connected to a grounding potential in order to obtain a voltage gain and a current gain.

However, in the circuit device 100 in which the above-described semiconductor device 105 is incorporated, there is a problem that the land 112 becomes larger compared to the semiconductor device 105 and that this inhibits a miniaturization of the circuit device 100. Specifically, regions for bonding the thin metal wires 103 must be ensured in a peripheral portion of the land 112 in order to connect the emitter electrodes of the semiconductor device to the land 112. Accordingly, in a case where a two-dimensional size of the semiconductor device 105 is 0.3 mm×0.3 mm, a two-dimensional size of the land 112 needs to be not less than approximately 1.5 mm×1.5 mm. That is, the land 112 having an area approximately 25 times as large as that of the semiconductor device 105 mounted thereon is required. This has inhibited the miniaturization of the entire circuit device 100.

Furthermore, there has been a problem that parasitic inductance components occur in the thin metal wires 103 and that high-frequency characteristics of the semiconductor device 105 are deteriorated. Magnitudes of the parasitic inductances caused by the thin metal wires 103 are proportional to lengths of the thin metal wires 103 and inversely proportional to diameters of the thin metal wires 103. Accordingly, for example, if the long and thin metal wires 103 having diameters of 25 μm and lengths of 1 mm are employed, large parasitic inductances occur, and the high-frequency characteristics of the semiconductor device 105 is deteriorated. In particular, in a case of the semiconductor device 105 which is operated at high frequencies of not less than 1 GHz, the high-frequency characteristics are greatly deteriorated by the parasitic inductances.

SUMMARY OF THE INVENTION

The present invention has been accomplished in a view of the above-described problems. A main object of the present invention is to provide a semiconductor device which contributes to a miniaturization of the entire device and in which parasitic inductances are reduced, and to provide a method of manufacturing the same.

The present invention provides a semiconductor device that includes a plurality of pad electrodes formed on a surface of a semiconductor substrate and electrically connected to an active region; at least one backside electrode provided on a back surface of the semiconductor substrate; at least one feedthrough electrode penetrating the semiconductor substrate in a thickness direction and connecting one of the pad electrode to the at least one backside electrode. The semiconductor device that includes that at least one of the pad electrodes, which is connected to a grounding potential, is connected to the at least one backside electrode through the feedthrough electrode.

The present invention also provides the above-mentioned semiconductor device, which includes that the plurality of the pad electrodes are connected to the at least one backside electrode through the at least one feedthrough electrode.

The present invention further provides the above-mentioned semiconductor device, which includes that a bipolar transistor is formed in the active region, and the pad electrode connected to an emitter region of the bipolar transistor is connected to the at least one backside electrode through the at least one feedthrough electrode.

The present invention further provides the above-mentioned semiconductor, which includes that a MOSFET is formed in the active region, and one of the pad electrodes connected to a source region of the MOSFET is connected to the at least one backside electrode through the at least one feedthrough electrode.

The present invention further provides the above-mentioned semiconductor device, which includes that the at least one backside electrode of the semiconductor substrate is fixed to a land-shaped conductive member, and one of the pad electrodes connected to the grounding potential is connected to the conductive member through the at least one feedthrough electrode and the at least one backside electrode.

The present invention further provides the above-mentioned semiconductor device, which includes that the other pad electrodes, which are not connected to the grounding potential, are electrically connected to other conductive members through thin metal wires.

The present invention further provides the above-mentioned semiconductor device, which includes that the at least one backside electrode is in direct contact with the back surface of the semiconductor substrate, and potentials of the at least one feedthrough electrode and the semiconductor substrate are made equal.

The present invention further provides the above-mentioned semiconductor device, which includes that a plurality of the backside electrodes are formed on the back surface of the semiconductor substrate, and each of backside electrodes are electrically connected to one of the pad electrodes through the at least one feedthrough electrode.

The present invention further provides the above-mentioned semiconductor device, which includes that the plurality of backside electrodes are insulated from the semiconductor substrate by insulating films covering the back surface of the semiconductor substrate.

The present invention further provides the above-mentioned semiconductor device, which includes that all the pad electrodes connected to the active region are connected to the at least one backside electrode through the at least one feedthrough electrode.

The present invention further provides the above-mentioned semiconductor device, which includes that the active region is formed inside a region surrounded by an isolation region, the at least one feedthrough electrode is formed inside at least one through hole penetrating the semiconductor substrate outside the isolation region, and the at least one feedthrough electrode is in contact with an inner wall of the at least one through hole.

Furthermore, the present invention provides a semiconductor device that includes a semiconductor substrate having a semiconductor layer in which an active element formed; a first electrode electrically connected to a diffusion region of the active element; at least one pad electrode provided to be integrated with the first electrode and to be extended to a peripheral portion of the semiconductor substrate; at least one feedthrough electrode provided in a layer under the at least one pad electrode and extended from a surface of the semiconductor layer to a back surface of the semiconductor substrate; and at least one backside electrode electrically connected to the at least one feedthrough electrode and provided on the back surface of the semiconductor substrate.

The present invention also provides the above-mentioned semiconductor device, which includes that the active element is any one of a BIP transistor and a MOS transistor, and the first electrode electrically connected to the diffusion region grounded is electrically connected to at least two feedthrough electrodes.

Furthermore, the present invention provides a method of manufacturing a semiconductor device that includes forming an active region in a surface of a semiconductor substrate; forming a pad on the surface of the semiconductor substrate, the pad being electrically connected to the active region; forming a through hole penetrating the semiconductor substrate, the through hole being located under the pad; and forming a backside electrode on a back surface of the semiconductor substrate, the backside electrode being electrically connected to the pad through a feedthrough electrode formed inside the through hole. The method includes that the through hole is formed outside an isolation region, the isolation region being formed to surround the active region, and the feedthrough electrode is formed to be in direct contact with an inner wall of the through hole.

The present invention also provides the above-mentioned method of the manufacturing the semiconductor device, which includes that the isolation region has any one of a trench structure, a LOCOS oxide film, and a PN junction isolation structure.

BRIEF DESCRIPTION OF THE DRAWINGS

FIG. 1A is a perspective view, and FIG. 1B is a cross-sectional view.

FIGS. 2A and 2B are cross-sectional views.

FIG. 3A is a perspective view, and FIG. 3B is a plan view.

FIG. 4A is a cross-sectional view, FIG. 4B is a plan view, and FIG. 4C is a cross-sectional view.

FIGS. 6A to 6D are cross-sectional views.

FIGS. 7A and 7B are cross-sectional views.

FIGS. 8A and 8B are cross-sectional views.

FIGS. 9A to 9C are cross-sectional views.

FIG. 10A is a perspective view, and FIG. 10B is a plan view.

FIG. 11A is a perspective view, FIG. 11B is a cross-sectional view, and FIG. 11C is a cross-sectional view.

FIGS. 12A and 12B are cross-sectional views.

DESCRIPTION OF THE PREFERRED EMBODIMENTS

First Embodiment

In this embodiment, a structure of a semiconductor device which includes feedthrough electrodes penetrating a semiconductor substrate will be described with reference to FIGS. 1A to 5B.

Figure 1A:
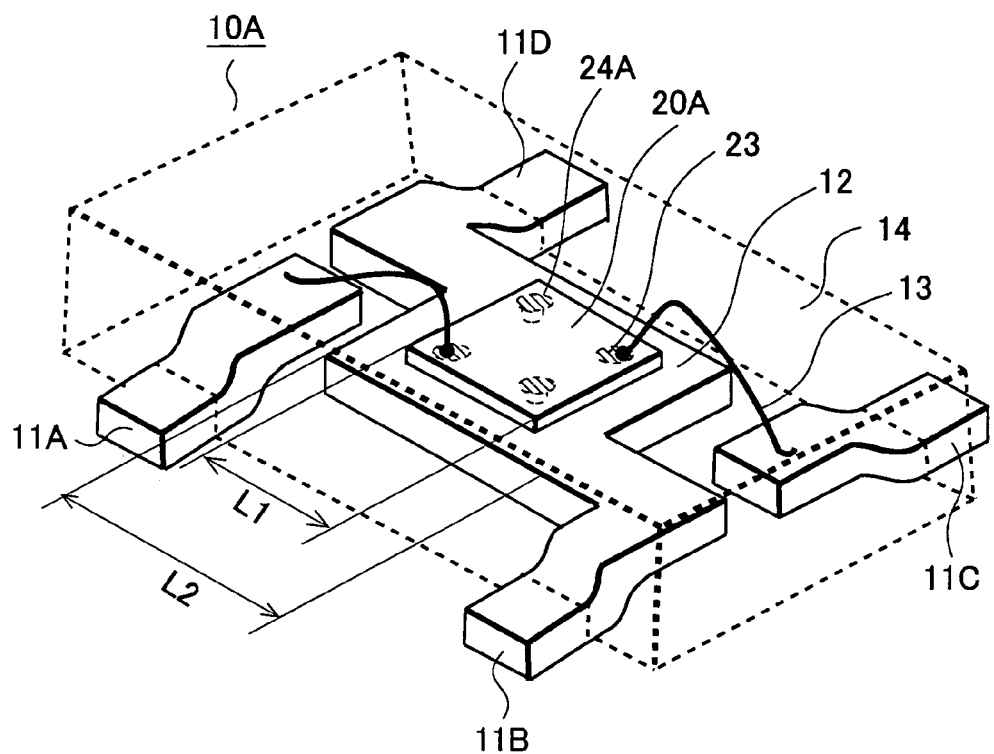
FIGS. 1A and 1B are views showing a semiconductor device of a first embodiment of the present invention.
Figure 1B:
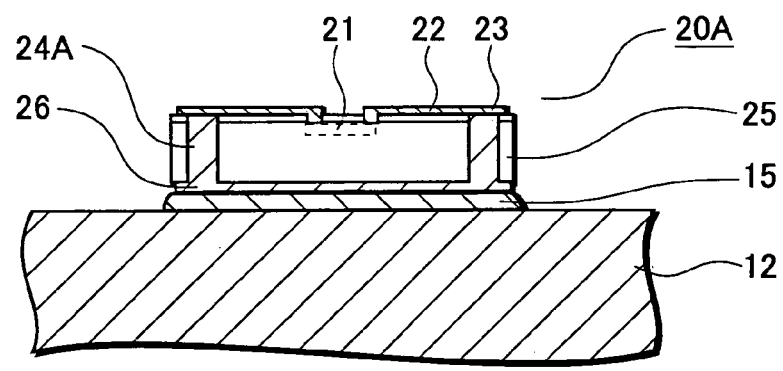

Referring to FIGS. 1A and 1B, a constitution of a circuit device 10A, in which a semiconductor device 20A of the preferred embodiment of the invention is incorporated, will be described. FIG. 1A is a perspective view of the circuit device 10A, and FIG. 1B is a cross-sectional view of the semiconductor device 20A.

Figure 2A:
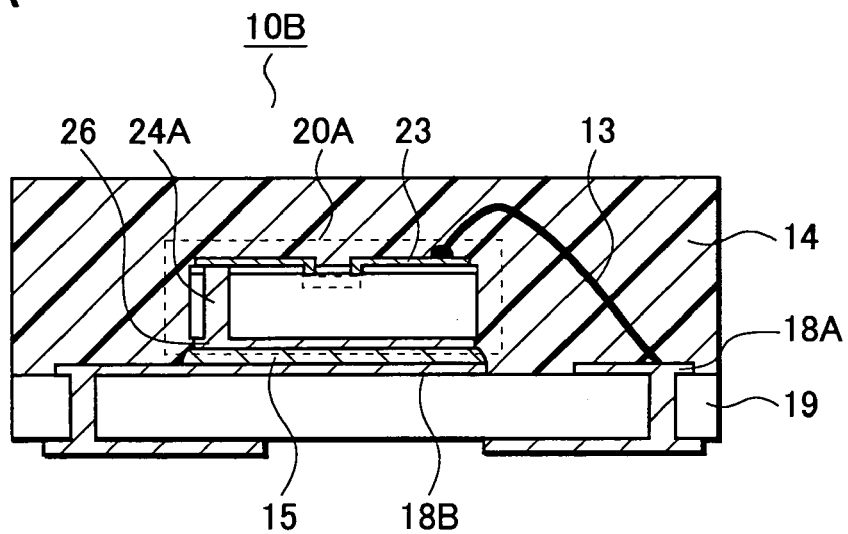
FIGS. 2A and 2B are views showing semiconductor devices of the first embodiment of the present invention.
Figure 2B:
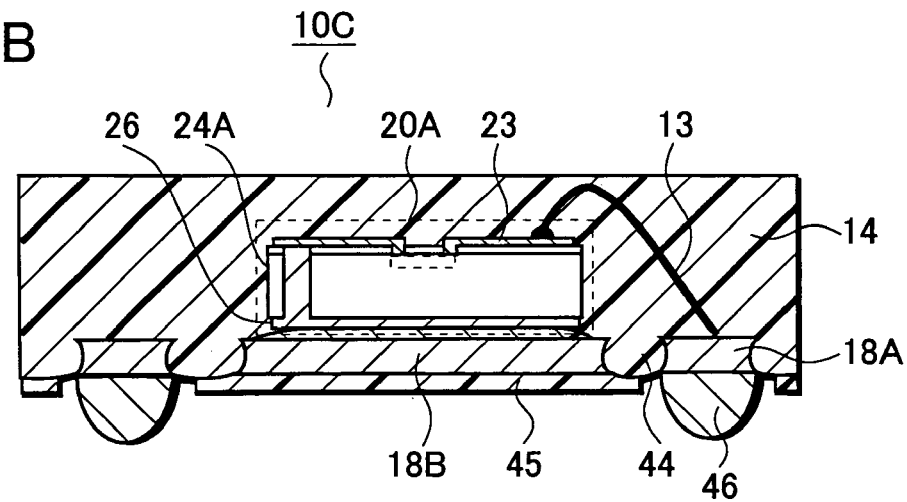

Referring to FIG. 1A, here, the semiconductor device 20A is incorporated in the circuit device 10A of a leadframe type. Specifically, the semiconductor device 20A is fixed to an upper surface of a land 12 placed in a center portion. Furthermore, from end portions of the land 12, two leads 11D and 11B extend outside. Moreover, leads 11A and 11C are provided near the land 12. The land 12 and the lead 11A and the like are examples of conductive members. The conductive members may be conductive patterns such as shown in FIGS. 2A and 2B.

To an upper portion of the land 12, the semiconductor device 20A is fixed with a conductive adhesive material such as a solder interposed therebetween. In an upper portion of the semiconductor device 20A, four pad electrodes 23 are formed. Here, two of the pad electrodes 23 are electrically connected to the land 12 through feedthrough electrodes 24A.

In addition, the other two pad electrodes 23 are connected to the leads 11A and 11C through thin metal wires 13, respectively.

The feedthrough electrodes 24A provided in the semiconductor device 20A may be constituted by metal films formed in through holes penetrating a semiconductor substrate 25. Furthermore, the feedthrough electrodes 24A can also be formed by filling the through holes with a metal such as a solder, W, Cu, or Al.

The leads 11A and 11C are connected to the pad electrodes 23 of the semiconductor device 20A through the thin metal wires 13. Here, the pad electrodes 23 connected to collector and base electrodes are connected to the leads 11A and 11c through the thin metal wires 13.

A sealing resin 14 seals a whole in a state in which parts of the leads 11A, 11B, 11C, and 11D are exposed to an outside.

Next, referring to FIG. 1B, the semiconductor device 20A fixed to the land 12 will be described. In the semiconductor device 20A, an active region 21 is formed on a surface of the semiconductor substrate 25. Here, the active region 21 is generally a region in which an active element such as a transistor or a diode is formed. In a case where a bipolar transistor is formed in the active region 21, a collector region, a base region, and an emitter region are formed. Alternatively, in a case where a MOSFET is formed in the active region 21, a gate region, a source region, and a drain region are formed. Alternatively, an IC or an LSI may be formed in the active region 21. Moreover, the pad electrodes 23 electrically connected to diffusion regions formed in the active region 21 are formed on the front surface of the semiconductor substrate 25 through rewiring patterns 22 extended to a peripheral portion of the active region 21. Furthermore, a backside electrode 26 is formed on at least a part of a back surface of the semiconductor substrate 25. Here, the backside electrode 26 is formed on an entire surface because the back surface is utilized as an emitter electrode. Furthermore, the feedthrough electrodes 24A penetrating the semiconductor substrate 25 in a thickness direction are formed so as to reach back surfaces of the pad electrodes 23.

Here, the back surface of the semiconductor substrate 25 may be insulated. Furthermore, the feedthrough electrodes 24A may be insulated from the semiconductor substrate 25 by, for example, an Si oxide film formed by a thermal oxidation or a CVD.

Moreover, the backside electrode 26 of the semiconductor device 20A is fixed to a surface of the land 12 with a fixing agent 15 interposed therebetween. As the fixing agent 15, a solder, a conductive paste, or the like can be employed. Here, since the land 12 is at a fixed potential (GND or Vcc), the pad electrodes 23 are connected to the fixed potential. Thus, desired electrodes can be fixed at a stable potential. Accordingly, an operation of a transistor formed in the active region 21 can be stabilized.

For example, heretofore, emitter, collector, and base electrodes have been connected to leads through thin metal wires. However, impedances of the thin metal wires have non-negligible magnitudes. In the preferred embodiment of the present invention, the feedthrough electrodes 24A are employed instead of thin metal wires. Accordingly, paths of the feedthrough electrodes 24A are short, and impedances thereof can be reduced. Furthermore, in a case where a large current is flowed, it should make diameters of the feedthrough electrodes 24A large. Thus, impedances of paths connected to the emitter electrodes can be reduced. Accordingly, characteristics can be considerably improved compared to those of a package in which emitter electrodes are connected by thin metal wires.

Next, referring to FIGS. 2A and 2B, constitutions of circuit devices 10B and 10C of other embodiments will be described. FIG. 2A is a cross-sectional view of the circuit device 10B including a circuit substrate 19. FIG. 2B is a cross sectional view of the circuit device 10C including conductive patterns 18A and 18B which are buried in the sealing resin 14.

Referring to FIG. 2A, in the circuit device 10B, the conductive patterns 18A and 18B formed on a surface of the circuit substrate 19 are electrically connected to the semiconductor device 20A. As the circuit substrate 19, a resin substrate such as a flexible sheet or a printed circuit board or a ceramic substrate can be generally employed. The conductive patterns 18A formed on the surface of the circuit substrate 19 are connected to the semiconductor device 20A through the thin metal wires 13. The conductive pattern 18B is connected to the backside electrode 26 of the semiconductor device 20A with the fixing agent 15 such as a solder interposed therebetween. Furthermore, the conductive patterns 18A and 18B are connected to conductive patterns formed on a back surface of the circuit substrate 19 via through holes formed in the circuit substrate 19. Moreover, the sealing resin 14 is formed on the surface of the circuit substrate 19 so as to cover the semiconductor device 20A and the thin metal wires 13.

In the circuit device 10B, an employment of the feedthrough electrodes 24A eliminates a necessity to connect the conductive pattern 18B to the semiconductor device 20A by use of thin metal wires. Accordingly, a size of the conductive pattern 18B can be reduced to a size equivalent to that of the semiconductor device 20A. Thus, a size of the entire circuit substrate 19 can be reduced.

Referring to FIG. 2B, in the circuit device 10C, the conductive patterns 18A and 18B, which are buried in the sealing resin 14, are electrically connected to the semiconductor device 20A. The conductive patterns 18A and 18B are buried in the sealing resin 14 in a state in which back surfaces of the conductive patterns 18A and 18B are exposed. Furthermore, the back surfaces of the conductive patterns 18A and 18B which are exposed from the sealing resin 14 are covered with a coating resin 45, except for portions where a soldering material is formed. Moreover, the conductive patterns 18A are isolated from the conductive pattern 18B by isolation grooves 44. This structure can be realized by, for example, bonding a pattern of a leadframe or the like to a flexible sheet, performing mounting and molding, and stripping the flexible sheet. Alternatively, this structure can also be realized by preparing a Cu foil, half-etching the Cu foil so that conductive patterns are left to be protruded, performing mounting and molding, and etching back a back surface of the Cu foil so that the sealing resin filled in the grooves, which are formed by a half etching, is exposed.

Figure 3A:
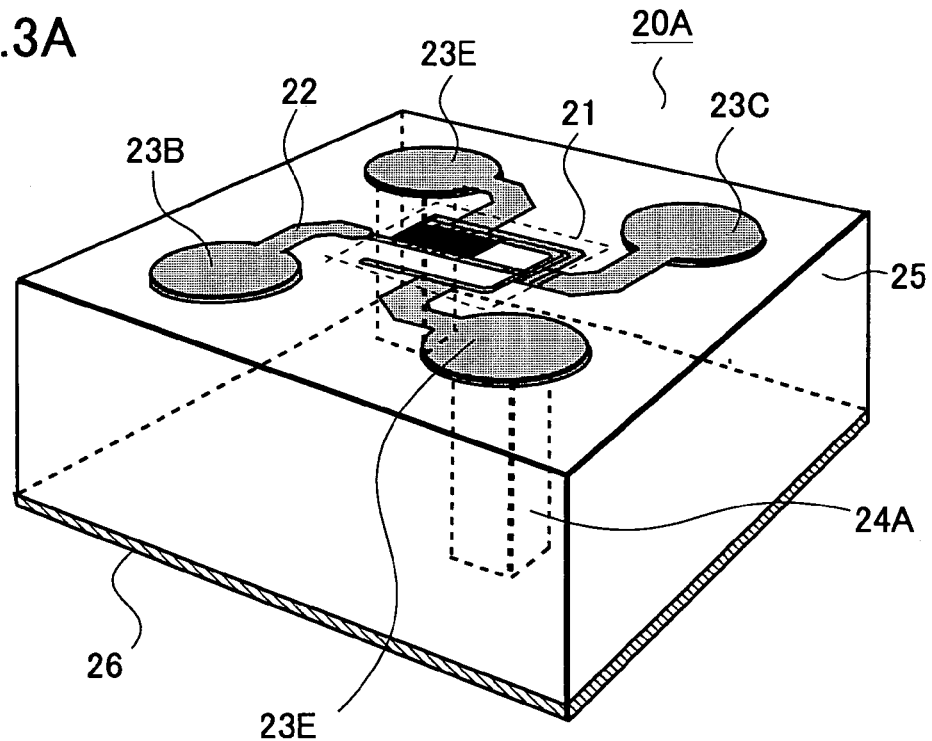
FIGS. 3A and 3B are views showing a semiconductor device of the first embodiment of the present invention.
Figure 3B:
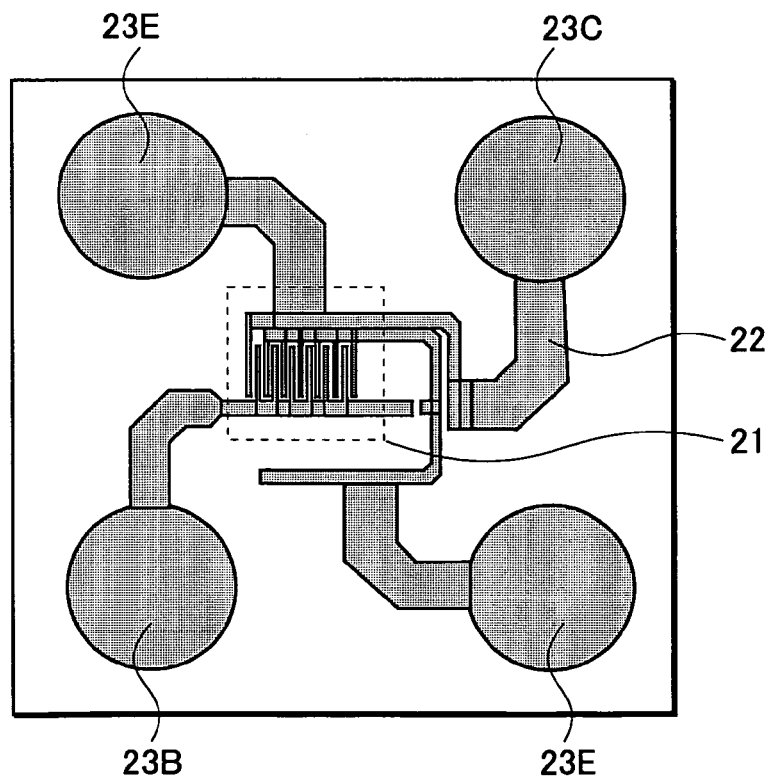
Figure 4A:
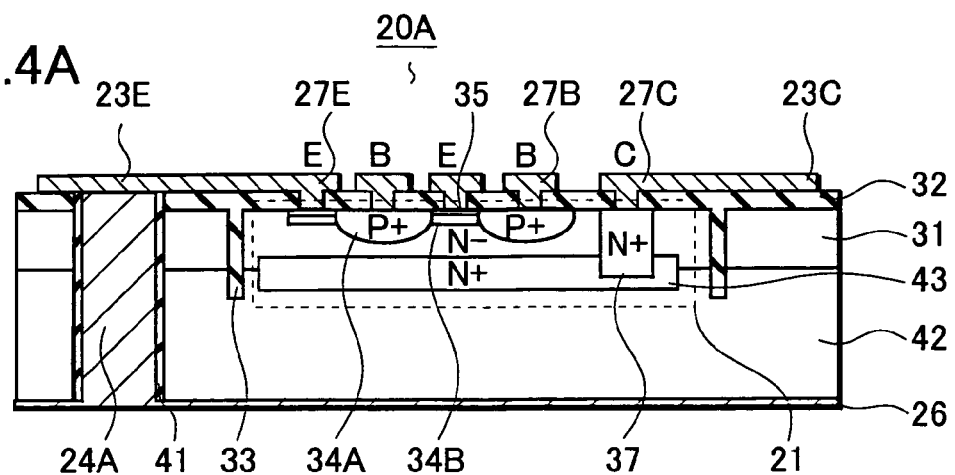
FIGS. 4A to 4C are semiconductor devices of the first embodiment of the present invention.
Figure 4B:
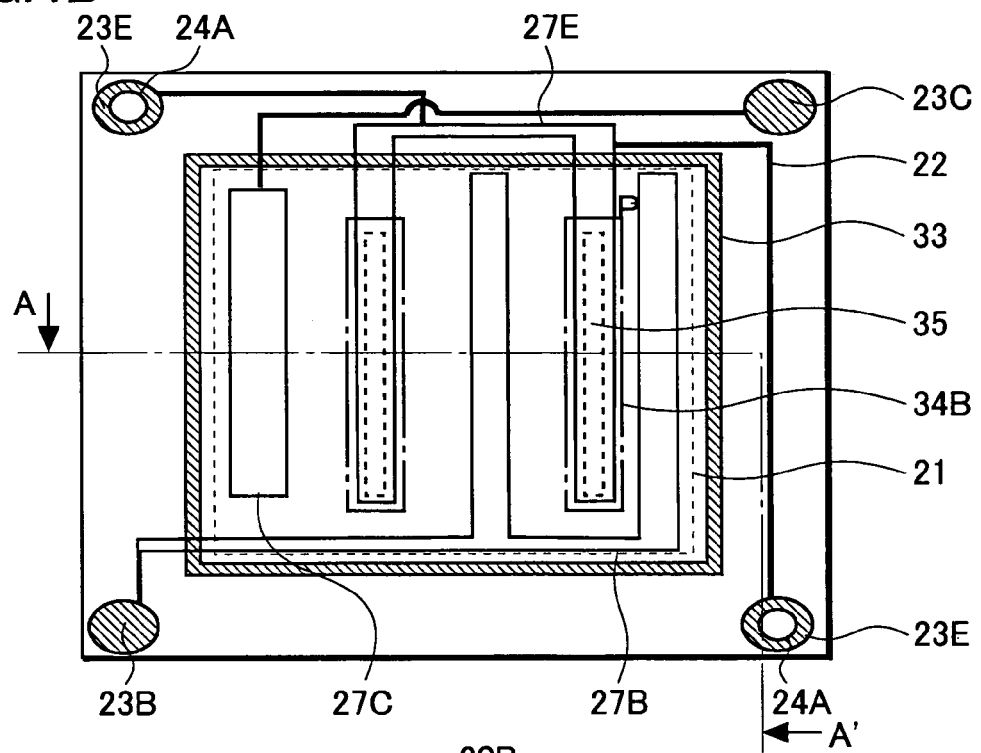
Figure 4C:
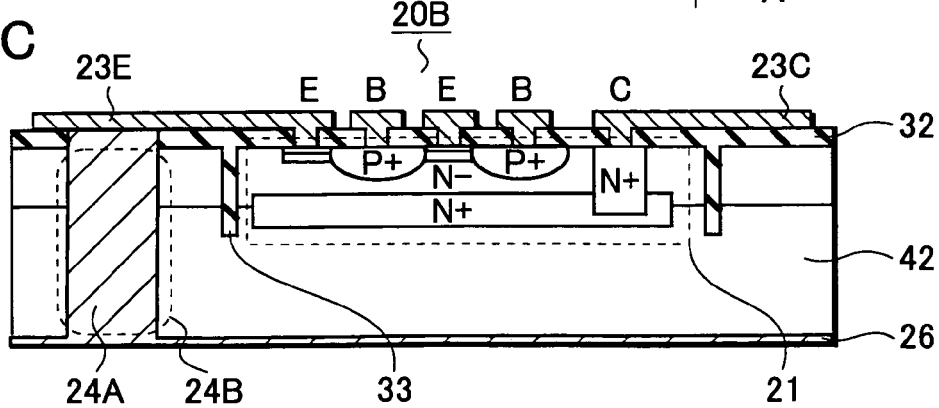

Next, referring to FIGS. 3A to 4C, a constitution of the semiconductor device 20A will be described. FIG. 3A is a perspective view of the semiconductor device 20A, and FIG. 3B is a plan view of the semiconductor device 20A as seen from above. FIG. 4A is a cross-sectional view of the semiconductor device 20A, and FIG. 4B is a schematic plan view showing a pattern of the active region 21. FIG. 4C shows a constitution of a semiconductor device 20B of another embodiment.

Referring to FIGS. 3A and 3B, the active region 21 is formed in a center portion of the surface of the semiconductor substrate 25. In addition, a collector pad electrode 23C, a base pad electrode 23B, and emitter pad electrodes 23E are formed in a peripheral portion of the surface of the semiconductor substrate 25. Each pad electrode and the active region 21 are connected through the rewiring pattern 22.

Here, since the semiconductor device 20A is used for a grounded-emitter circuit, the emitter pad electrodes 23E are connected to the backside electrode 26 through the feedthrough electrodes 24A. Accordingly, in a case where the semiconductor device 20A is used for a grounded-base circuit, the base pad electrode 23B is connected to the backside electrode 26 through the feedthrough electrode 24A. Furthermore, in a case where the semiconductor device 20A is used for a grounded-collector circuit, the collector pad electrode 23C is connected to the backside electrode 26 through the feedthrough electrode 24A. In this embodiment, impedances are reduced by employing the feedthrough electrodes 24A. Moreover, since the two feedthrough electrodes 24A are employed, an impedance of the feedthrough electrodes 24A becomes a half because the electrodes are connected in parallel. That is, if the electrodes are connected in parallel through the n feedthrough electrodes 24A (n is three or more), an impedance becomes 1/n.

Moreover, in the active region 21, other than a bipolar transistor, for example, a metal-oxide-semiconductor field effect transistor (MOSFET) can also be formed. In this case, a pad electrode (anyone of a drain electrode, a source electrode, and a gate electrode) which is connected to a grounding potential is connected to the backside electrode 26 through the feedthrough electrode 24A. In particular, in a case where the semiconductor device 20A is used for a grounded-source circuit having a large gain, a pad connected to the source electrode is connected to the backside electrode 26 through the feedthrough electrode 24A. In this case, an impedance can be reduced by employing a plurality of the feedthrough electrodes 24A.

Referring to FIG. 4A, details of the active region 21 in which an active element is formed will be described. An $N^+$ type buried layer 43 is provided in an upper portion of a P-type semiconductor substrate 42, and an $N^-$ type epitaxial layer 31 (semiconductor layer) is formed thereon. Furthermore, $P^+$ type external base regions 34A, P-type active base regions 34B, and an $N^+$ type collector contact region 37 are formed on a surface of the $N^-$ type epitaxial layer 31. Moreover, N-type emitter regions 35 (diffusion regions) are formed in upper portions of the active base regions 34B. Furthermore, the $N^+$ type collector contact region 37 is formed from the surface of the $N^-$ type epitaxial layer 31 to a position where the $N^+$ type collector contact region 37 reaches the $N^+$ type buried layer 43.

A trench 33 extends from the surface of the $N^-$ type epitaxial layer 31 to a position where the trench 33 reaches the P-type semiconductor substrate 42. In the trench 33, an oxide film 32 is buried. An isolation region made of the trench 33 is formed so as to surround the active region 21, whereby a device isolation for the active region 21 is achieved. Although the active region 21 is isolated by a trench structure in this example, the active region 21 may be isolated by a local-oxidation-of-silicon (LOCOS) oxide film or a PN junction isolation. Furthermore, the device isolation may be performed by use of the trench 33 having an oxide film formed on a surface thereof and polysilicon buried therein.

The emitter pad electrodes 23E (first electrodes) are formed at positions outside the trench 33 and connected to the backside electrode 26 through the feedthrough electrodes 24A.

The feedthrough electrodes 24A made of a conducting material buried in through holes which are formed so as to penetrate the P-type semiconductor substrate 42, the $N^-$ type epitaxial layer 31, and the oxide film 32. The feedthrough electrodes 24A connect the emitter pad electrodes 23E to the backside electrode 26. The feedthrough electrodes 24A can be formed of a plated film integrated with the backside electrode 26. This plated film is formed on sidewalls of the through holes and a back surface of the P-type semiconductor substrate 42. Furthermore, sidewall insulating films 41 made of a silicon oxide film or the like are formed on side surfaces of the feedthrough electrodes 24A.

Since the P-type semiconductor substrate 42 is isolated from the active region 21 by the trench 33 and the buried layer 43, the sidewall insulating films 41 may not be formed between the P-type semiconductor substrate 42 and the feedthrough electrodes 24A. However, insulating films are necessary, for example, in a case where $P^+$ type isolation region or the like penetrating the epitaxial layer 31 is formed, the P-type semiconductor substrate 42 is fixed to GND, and the emitter electrode is fixed to a potential other than GND. That is, in a case where potentials of the P-type semiconductor substrate 42 and the emitter electrode differ from each other, the sidewall insulating films 41 are necessary.

Here, the feedthrough electrodes 24A may be formed by filling the through holes with a solder, an alloy of W, Cu, Al, or the like, or a metal. In particular, in a case where the feedthrough electrodes 24A made of W or Cu are formed, surfaces of the through holes are preferably protected by barrier films made of Ti/TiN lamination films or Ta/TaN lamination films.

The backside electrode 26 is formed on the back surface of the P-type semiconductor substrate 42 and connected to the feedthrough electrodes 24A. The backside electrode 26 and the P-type semiconductor substrate 42 are insulated from each other by an insulating film in a case where the semiconductor substrate 42 is not electrically isolated from the active region 21. Furthermore, in a case where the semiconductor substrate 42 and the active region 21 are electrically isolated from each other by the trench 33, the P-type semiconductor substrate 42, and the $N^+$ type buried layer 43, the backside electrode 26 may be brought into direct contact with the back surface of the P-type semiconductor substrate 42.

Parasitic capacitances occurring between the P-type semiconductor substrate 42 and the feedthrough electrodes 24A can be reduced by bringing the backside electrode 26 and the P-type semiconductor substrate 42 into direct contact with each other. Specifically, if the sidewall insulating films 41, which are insulators, are located between the P-type semiconductor substrate 42 and each of the feedthrough electrodes 24A, the parasitic capacitances due to potential differences occur. The direct contact of the backside electrode 26 electrically connected to the feedthrough electrodes 24A with the P-type semiconductor substrate 42 can make potentials of the feedthrough electrodes 24A equal to that of the P-type semiconductor substrate 42, and can reduce the above-described parasitic capacitances.

Referring to FIG. 4B, a constitution of the active region 21 will be further described. It should be noted that FIG. 4A is a cross-sectional view taken along the line A-A' of FIG. 4B. In this example, the active region 21 is formed in a region surrounded by the trench 33. In the active region 21, the two emitter regions 35 are formed to be long in a vertical direction, and the active base regions 34A are formed so as to surround the emitter regions 35. Accordingly, an emitter electrode 27E is formed to have two comb tooth-like portions and connected to the emitter pad electrodes 23E at an upper left and a lower right of a chip through the rewiring patterns 22 in an integrated manner. On the other hand, a base electrode 27B is in contact with the external base regions 34A, formed to have two comb tooth-like portions placed alternately with the emitter electrode 27E, and connected to the base pad electrode 23B at a lower left of the chip through the rewiring pattern 22. Furthermore, a collector electrode 27C is in contact with the collector contact region 37 reaching the buried layer 43 and formed on a left side of the active region 21. Moreover, the collector electrode 27C is connected through the rewiring pattern 22 to the collector pad electrode 23C formed on an upper right of the chip.

In this embodiment, the pad electrodes such as the emitter pad electrodes 23E are provided outside the trench 33, which is an isolation region. The reason is as follows.

First, if an attempt to form the feedthrough electrodes 24A in emitter, base, and collector regions are made, widths of these regions are 1 μm or less. Accordingly, there occur problems of an alignment and the like at a time of the formation of the feedthrough electrodes 24A. Second, if the pad electrodes are placed on the active region 21 or in a vicinity thereof, a parasitic capacitance and the like occur in an element. Accordingly, an element, which is favorable in terms of both a manufacturing method and characteristics, can be obtained by forming sufficiently large pad electrodes outside the isolation region and forming the feedthrough electrodes 24A under back surfaces thereof.

Referring to FIG. 4C, a structure of the semiconductor device 20B of another embodiment will be described. A basic constitution of the semiconductor device 20B is the same as that of the above-described semiconductor device 20A. A difference is that the sidewall insulating films 41 (see FIG. 4A) are omitted.

Specifically, inner walls of through holes 24B are not covered with the sidewall insulating films 41 such as described above. Accordingly, the feedthrough electrodes 24A made of a conducting material such as a copper are in direct contact with sidewalls of the through holes 24B which are made of a semiconductor. Thus, the constitution of the semiconductor device 20B can be simplified. Furthermore, since a step of manufacturing the sidewall insulating films 41 can be omitted, a manufacturing cost of the semiconductor device 20B can be reduced.

The active region 21, in which a bipolar transistor is formed, is surrounded by the trench 33 to be electrically isolated from other regions. Moreover, the feedthrough electrodes 24A are located outside the region surrounded by the trench 33. Accordingly, the active region 21 and the feedthrough electrodes 24A are electrically isolated from each other by the trench 33. Thus, even if the feedthrough electrodes 24A are in direct contact with the semiconductor substrate 42, the active region 21 and the feedthrough electrodes 24A are not short-circuited.

Figure 5A:
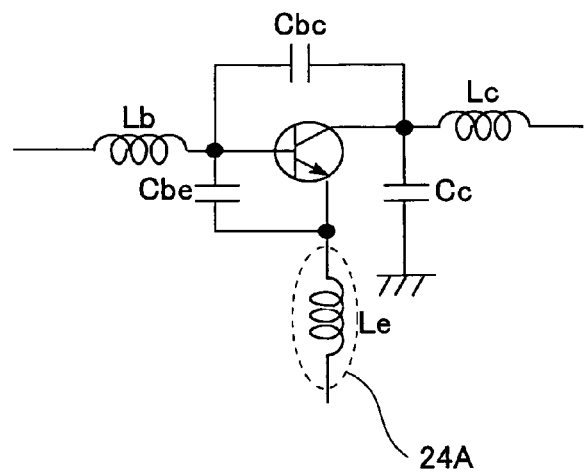
FIG. 5A is an equivalent circuit diagram of a semiconductor device of the first embodiment of the present invention.
Figure 5B:
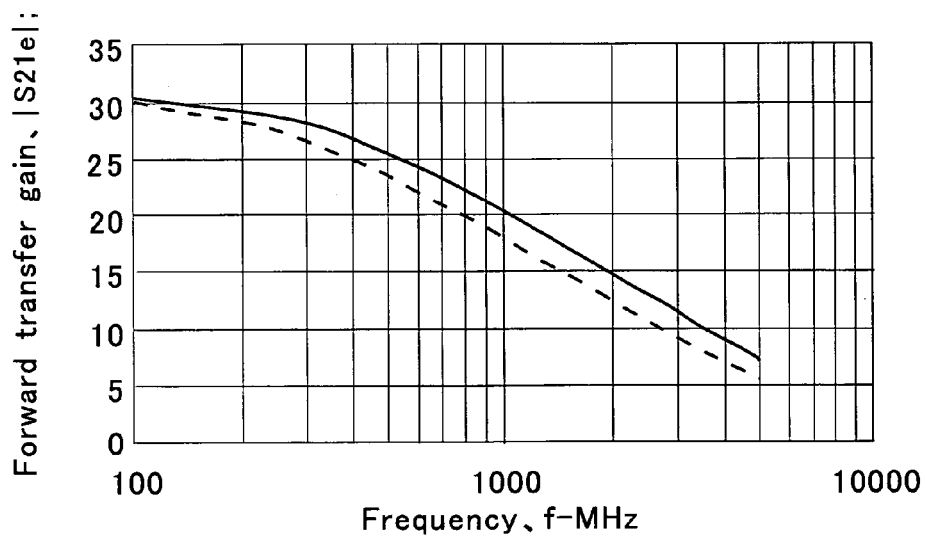
FIG. 5B is a graph showing simulation results.

Next, referring to FIGS. 5A and 5B, a description will be given of results of simulations performed in order to confirm effects of this embodiment. FIG. 5A is an equivalent circuit of a circuit device in which the semiconductor device 20A as a bipolar transistor is incorporated. FIG. 5B is a graph showing frequency characteristics of semiconductor devices.

Referring to FIG. 5A, a parasitic inductance occurs in a path connected to each electrode of the bipolar transistor used in a grounded-emitter circuit. Here, the parasitic inductance of the path connected to the base electrode is denoted by $L_b$, that of the path connected to the collector electrode is denoted by $L_c$, and that of the path connected to the emitter electrode is denoted by $L_e$. Furthermore, it is assumed that predetermined parasitic capacitances occur between the respective electrodes of the transistor.

In this embodiment, the above-described $L_e$ is reduced by using the feedthrough electrodes 24A penetrating the semiconductor substrate instead of thin metal wires connected to emitter pad electrodes. Here, the $L_e$ of a conventional example, in which the thin metal wires are used, was assumed to be 1.0 nH, and the $L_e$ of this embodiment, in which the feedthrough electrodes 24A are used, was assumed to be 0.5 nH, which is a half of that of the conventional example. Furthermore, the conventional example and this embodiment were assumed to be equal in values of other parasitic inductances and parasitic capacitances, and a change of a forward transfer gain with respect to a change of a frequency was measured.

Referring to FIG. 5B, a description will be given of the results of the simulations performed under the above-described conditions. A horizontal axis of this graph represents the frequency, and a vertical axis thereof represents the forward transfer gain. The result of performing the simulation under the conditions for the conventional example is shown by a dotted line, and the result of performing the simulation under the conditions for the present application is shown by a full line.

From this graph, it can be seen that the semiconductor device of this embodiment in which the feedthrough electrodes are used has a larger forward transfer gain than that of the conventional example in which thin metal wires are used, particularly in a high-frequency region. Specifically, in a relatively low-frequency region in which a frequency is 100 MHz, a transfer gain of the semiconductor device of this embodiment is approximately equal to that of the conventional example (approximately 30 dB). As the frequency increases, the transfer gains of both this embodiment and the conventional example decrease. This is because the above-described parasitic capacitances and parasitic inductances increase as the frequency increases. However, in the semiconductor device of this embodiment in which the feedthrough electrodes are used, a decrease in the transfer gain thereof associated with an increase in the frequency is smaller than that of the conventional example. For example, in a 1 GHz (1000 MHz) frequency band, the transfer gain of this embodiment is approximately 2 to 2.5 dB, which is better than that of the conventional example. Accordingly, the semiconductor device of this embodiment makes it possible to improve characteristics, particularly in the high-frequency region.

Hereinafter, advantages of this embodiment will be described.

Referring to FIGS. 3A and 3B, in this embodiment, the parasitic inductances of the paths connected to the emitter electrodes can be reduced by connecting the emitter pad electrodes 23E, which are connected to the grounding potential, to the backside electrode 26 through the feedthrough electrodes 24A.

Specifically, the emitter pad electrodes 23E are connected to the land (not shown) located under the backside electrode 26 through the feedthrough electrodes 24A. Accordingly, the emitter electrodes 23E and the land (not shown) are connected by shortest paths penetrating the semiconductor substrate 25. Furthermore, the feedthrough electrodes 24A have much larger diameters compared to those of thin metal wires. Specifically, the thin metal wires have diameters of 20 μm and lengths of 1 mm, whereas the feedthrough electrodes 24A have diameters of 70 μm and lengths of 150 μm. As described above, a magnitude of a parasitic inductance is proportional to a length of a path and inversely proportional to a diameter of the path. Thus, in this embodiment, the parasitic inductances of the paths connected to the emitter electrodes are considerably reduced by using the feedthrough electrodes 24A having short and thick paths, in a comparison with those of the conventional example in which a connection is performed by use of the thin metal wires. Accordingly, an effect of improvement in the characteristics by use of the feedthrough electrodes 24A is large, particularly in a case where the semiconductor device 20A performs switching at a high frequency of not less than 1 GHz.

It is also possible to connect a pad electrode (the collector pad electrode 23C or base pad electrode 23B) other than the emitter pad electrodes 23E to the backside electrode 26 by use of the feedthrough electrode 24A. However, if the collector pad electrode 23C is connected to the backside electrode 26 through the feedthrough electrode 24A, a length of an interconnection connected to the collector electrode becomes long, and a parasitic capacitance between a collector and a base becomes large. Thus, high-frequency characteristics are deteriorated. The same is true in a case where the base pad electrode 23B is connected to the backside electrode 26 through the feedthrough electrode 24A. Accordingly, as described above, it is preferable that the emitter pad electrodes 23E be connected by use of the feedthrough electrodes 24A and that the other electrodes, the base pad electrode 23B and the collector pad electrode 23C, be connected to an outside by use of the thin metal wires.

Furthermore, referring to FIGS. 1A and 1B, according to this embodiment, the land 12 can be made small with respect to the semiconductor device 20A, and therefore the entire circuit device 10 can be miniaturized. Specifically, the pad electrodes 23 formed on a surface of the semiconductor device 20A are connected to the land 12 through the feedthrough electrodes 24A penetrating the semiconductor substrate 25. That is, the pad electrodes 23 are connected to the land 12 without using the thin metal wires. Accordingly, there is no necessity to provide regions for bonding the thin metal wires on the surface of the land 12. Thus, a size of the land 12 can be made approximately equal to that of the semiconductor device 20A. In practice, the land 12 is formed to be slightly larger than the semiconductor device 20A in a consideration of a displacement at a time of a fixation of the semiconductor device 20A. For example, a length L1 of one side of the semiconductor device 20A is 0.3 mm, and a length L2 of one side of the land 12 is approximately 0.4 mm. Accordingly, a length of a side of the land 12 can be reduced by a factor of approximately three compared to that of the conventional example.

Second Embodiment

Next, a method of manufacturing a semiconductor device 20A of which structure is shown in FIG. 4A will be described with reference to FIGS. 6A to 8B. First, referring to FIGS. 6A to 6D, a description will be given of a method of forming an active region 21 made of a bipolar transistor.

Figure 6A:
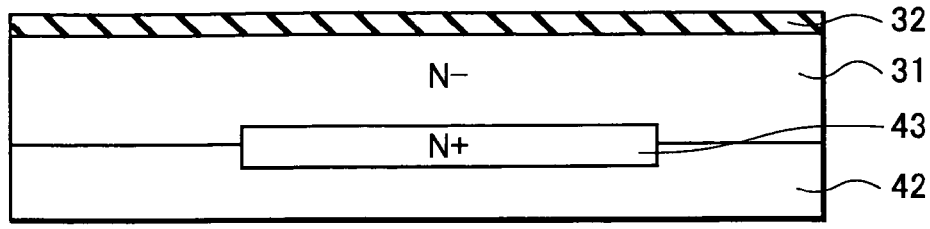
FIGS. 6A to 6D are views showing a method of manufacturing a semiconductor device of a second embodiment of the present invention.

First, referring to FIG. 6A, an N⁺ type buried layer 43 is provided by an ion implantation in a surface of a P-type semiconductor substrate 42 having a thickness of approximately 600 μm. Furthermore, an N⁻ type epitaxial layer 31 is formed on an upper surface of the P-type semiconductor substrate 42. A thickness of the N⁻ type epitaxial layer 31 is approximately 1.5 μm. Then, an entire surface is oxidized, and thereby an oxide film 32 having a thickness of approximately 0.05 μm is formed on an upper surface of the N⁻ type epitaxial layer 31.

Figure 6B:
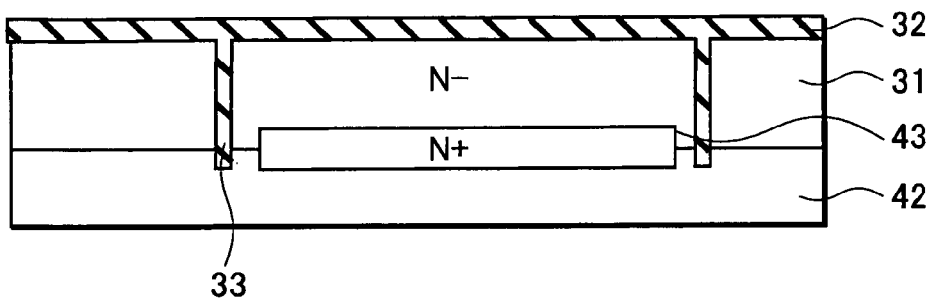

Next, referring to FIG. 6B, a trench 33 is formed so as to surround an active region to be formed, and an inside of the trench 33 is filled with an oxide film. Here, the oxide film 32 and the N⁻ type epitaxial layer 31 in a portion where the trench 33 is to be formed are selectively removed. The removal of the oxide film 32 is performed by use of a CF₄-based gas. The removal of the N⁻ type epitaxial layer 31 is performed by a dry etching using a halogen-based gas. The trench 33 needs to reach the P-type semiconductor substrate 42. A specific depth of the trench 33 is, for example, approximately 3.5 μm. After the trench 33 has been formed, the inside of the trench 33 is filled with the oxide film 32 by performing an oxidation treatment. Here, it is acceptable to perform an isolation by a LOCOS oxide film or a PN junction instead of the trench 33.

Figure 6C:
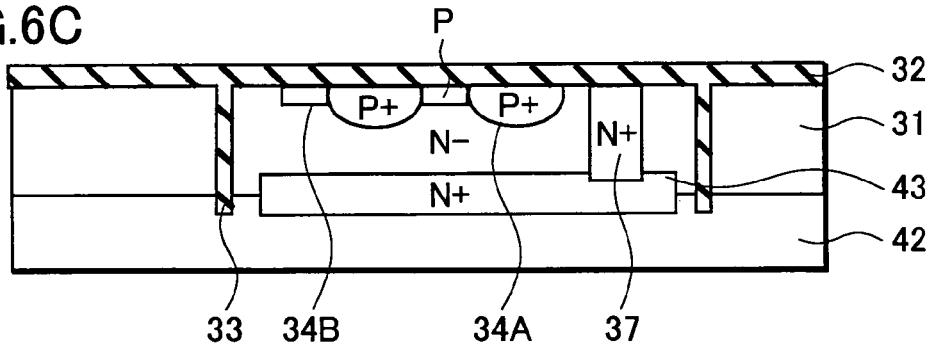

Subsequently, referring to FIG. 6C, a collector contact region 37, an external base regions 34A, and an active base regions 34B are formed by an ion implantation. The collector contact region 37 is formed to reach an N⁺ type buried layer 43, and phosphorus (P) is employed as ionic species. Furthermore, the external base regions 34A of a P⁺ type and the active base regions 34B of a P-type are formed by an ion implantation. As ionic species implanted, in order to form the external base regions 34A and the active base regions 34B, boron (B) is employed.

Figure 6D:
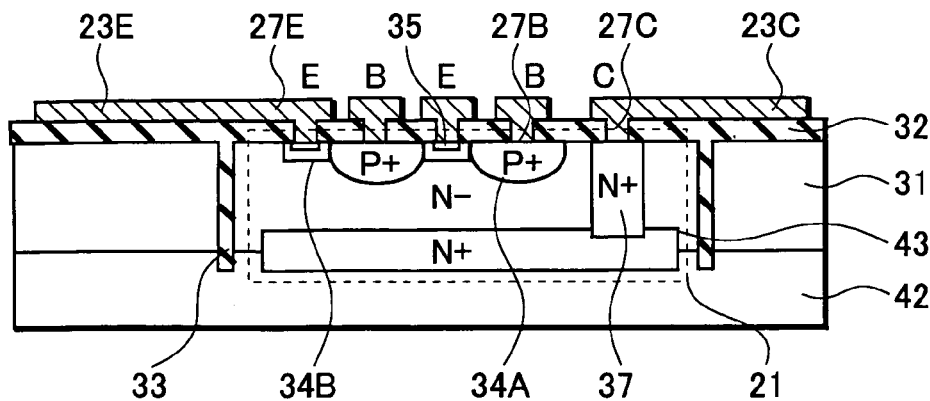

Next, referring to FIG. 6D, opening portions having diameters of approximately 0.5 μm are provided by partially removing the oxide film 32; and emitter electrodes 27E, a base electrode 27B, and a collector electrode 27C are formed. Here, emitter regions 35 are formed by a diffusion of arsenic ions in polysilicon constituting the emitter electrodes 27E. These electrodes are formed by depositing Ti, Pt, and Au by a vacuum deposition and performing an etching so that desired shapes are obtained. The emitter electrode 27E is formed as the emitter pad electrodes 23E outside the trench 33. In addition, the collector electrode 27C is also formed as the collector pad electrode 23C outside the trench 33. Furthermore, though not shown, the base electrode 27B is also formed as the base pad electrode outside the trench 33. After the respective electrodes have been formed, the electrodes are covered with insulating films in order to protect interconnection portions.

Moreover, after the above-described steps have been finished, the P-type semiconductor substrate 42 is etched so that a thickness thereof becomes approximately 100 μm.

Although the active region is formed in the surface of the P-type semiconductor substrate 42 in the above-described description, the active region can also be formed in a surface of an undoped semiconductor substrate. In this case, the surface of the undoped semiconductor substrate is covered with a silicon oxide film, and the active region is formed in a semiconductor layer deposited on this silicon oxide film.

Next, referring to FIGS. 7A to 8B, a description will be given of steps performed until the emitter pad electrodes 23E and a backside electrode 26 are connected by use of feedthrough electrodes 24A.

Figure 7A:
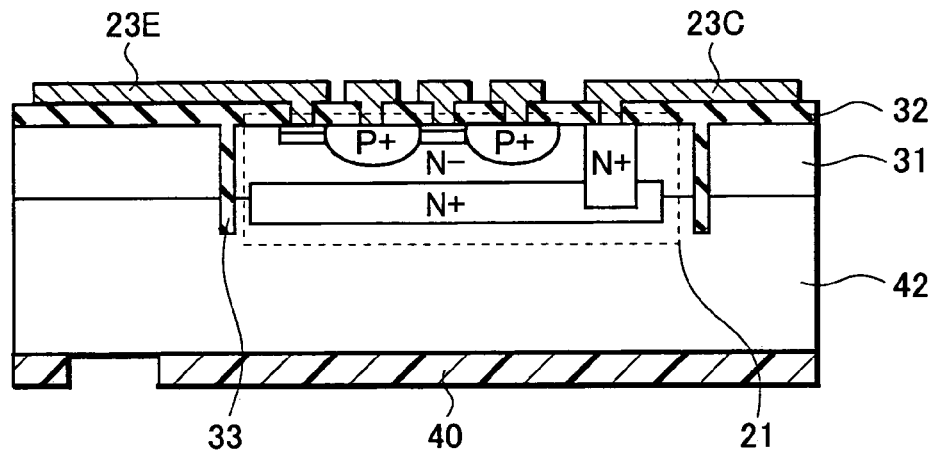
FIGS. 7A and 7B are views showing the method of manufacturing the semiconductor device of the second embodiment of the present invention.

First, referring to FIG. 7A, the back surface of the P-type semiconductor substrate 42 is covered with an etching resist 40. In the resist 40, regions, which correspond to portions under the emitter pad electrodes 23E, are partially opened.

Figure 7B:
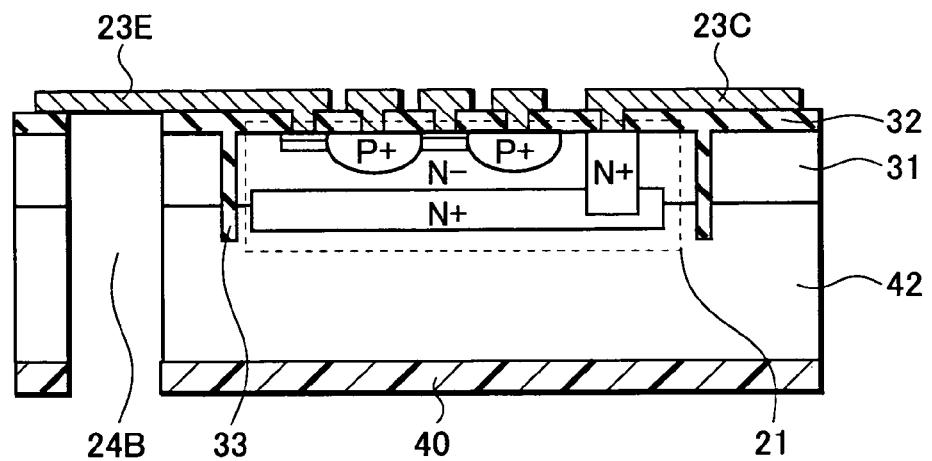

Next, referring to FIG. 7B, through holes 24B having diameters of approximately 70 μm and lengths of approximately 150 μm are formed by dry-etching the P-type semiconductor substrate 42 and the like by use of the resist 40 as a mask. As an etching gas used for a dry etching, a gas containing at least $SF_7$, $O_2$, or $C_4F_3$ is used. By this step, back surfaces of the emitter pad electrodes 23E are exposed through the through holes 24B. Specific shapes of the through holes 24B may be cylindrical or prismatic. Furthermore, the through holes 24B can also be formed by use of a wet etching or a laser.

Here, if the through holes 24B are formed after the semiconductor substrate 42 is thinned by combining a back grind and a plasma etching or a wet etching, an etching time can be reduced. For example, the semiconductor substrate 42 is ground by a back grind from a back surface, irregularities, which are formed by the grind, are removed by a plasma etching or a wet etching. Furthermore, the semiconductor substrate 42 may be ground from the back surface by only a wet etching or a plasma etching.

Figure 8A:
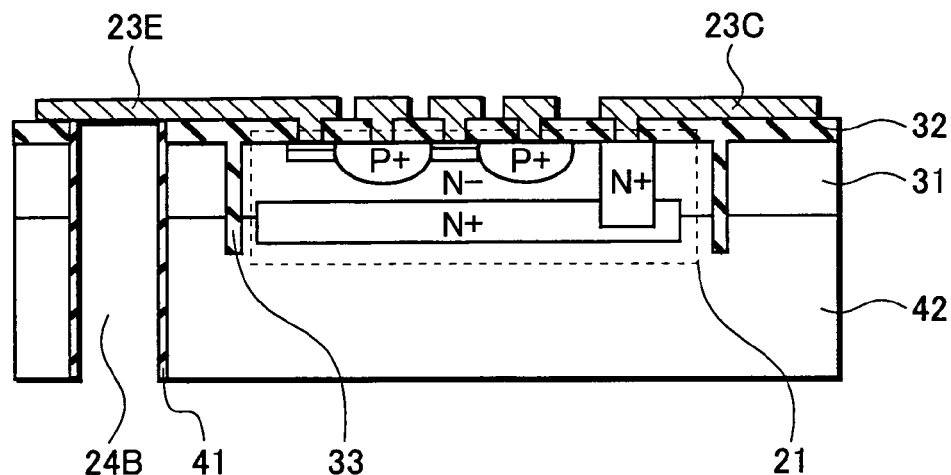
FIGS. 8A and 8B are views showing the method of manufacturing the semiconductor device of the second embodiment of the present invention.

Next, referring to FIG. 8A, sidewall insulating films 41 are formed on the sidewalls of the through holes 24B. As a material for the sidewall insulating films 41, a silicon oxide film, a silicon nitride film, or a resin film can be employed. Covering the sidewalls of the through holes 24B with the sidewall insulating films 41 makes it possible to insulate a conducting material to be filled into the through holes 24B from the P-type semiconductor substrate 42.

In a method of manufacturing the sidewall insulating films 41, first, the entire back surface of the P-type semiconductor substrate 42, which includes the inner walls of the through holes 24B, is covered with an insulating film made of a $SiO_2$ film or a SiN film. These insulating films are formed by, for example, a plasma CVD. Moreover, this insulating film is removed by an anisotropic etching, whereby the sidewall insulating films 41 are left on the sidewalls of the through holes 24B and the insulating films in other portions are removed. That is, the insulating films, which cover the back surfaces of the emitter pad electrodes 23E and the back surface of the P-type semiconductor substrate 42, are removed. Furthermore, in a case where the backside electrode to be formed and the P-type semiconductor substrate 42 are insulated from each other, an oxide film may be left on the back surface of the P-type semiconductor substrate 42.

Figure 8B:
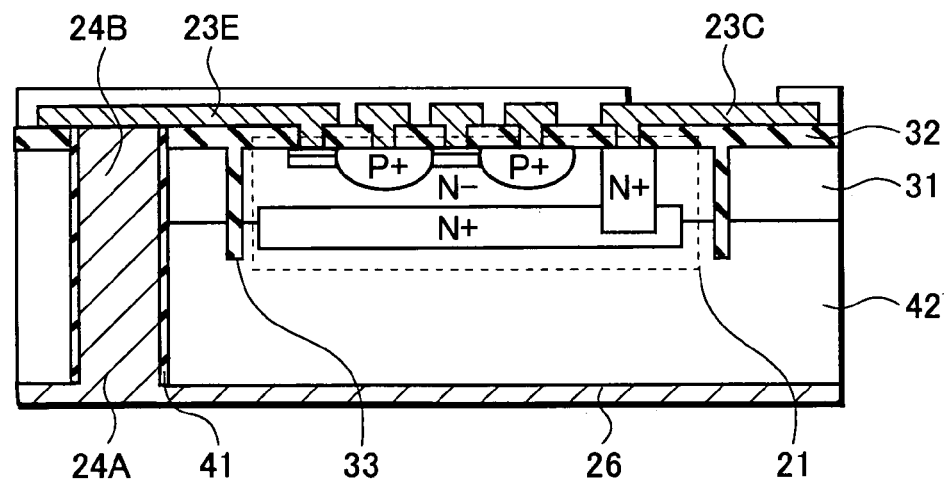

Next, referring to FIG. 8B, a metal film is formed so as to cover the inner walls of the through holes 24B and the back surface of the P-type semiconductor substrate 42. The metal film formed in the through holes 24B becomes the feedthrough electrodes 24A, and the metal film formed on the back surface of the P-type semiconductor substrate 42 becomes the backside electrode 26. The feedthrough electrodes 24A and the backside electrode 26 can be formed by a plating or a sputtering. In a case where the backside electrode 26 is formed by a plating, first, a seed layer (not shown), which has a thickness of approximately several hundred nm and is made of Cu, is formed on the inner walls of the through holes 24B and the entire back surface of the P-type semiconductor substrate 42. Here, an electroless plating is preferable. Next, an electrolytic plating is performed using this seed layer as an electrode, whereby a metal film, which has a thickness of approximately several μm and is made of Cu, is formed on the inner walls of the through holes 24B and the back surface of the P-type semiconductor substrate 42. Thus, the backside electrode 26 is formed which is electrically connected to the emitter pad electrodes 23E through the feedthrough electrodes 24A.

Here, though insides of the through holes 24B are fully filled with Cu formed by a plating, this filling may be incomplete. That is, cavities may be provided in the feedthrough electrodes 24A. Furthermore, the backside electrode 26 can also be formed by a sputtering or the like, which is a method other than a plating.

Furthermore, the feedthrough electrodes 24A may be formed of a metal material other than plated films. That is, the feedthrough electrodes 24A can also be formed by filling the through holes 24B with a metal such as a solder, W, Cu, or Al.

After the above-described step has been finished, the P-type semiconductor substrate 42 and each layer thereon are divided by a dicing, whereby the semiconductor device 20A shown in FIGS. 3A and 3B is completed. Moreover, through steps of a die bonding, a wire bonding, and a resin sealing, a circuit device 10A shown in FIGS. 1A and 1B is completed.

In the above description, the feedthrough electrodes 24A are formed only under the emitter pad electrodes 23E. However, in a case where the collector pad electrode 23C is also connected to the backside electrode 26, the feedthrough electrode 24A is also provided under the collector pad electrode 23C. In this case, the backside electrode 26 is further patterned into a predetermined pattern.

Furthermore, in the aforementioned description, the backside electrode 26 is in direct contact with the back surface of the semiconductor substrate 42. However, the back surface of the semiconductor substrate 42 may be covered with an insulating film to form the backside electrode 26 on a surface of this insulating film.

Third Embodiment

In this embodiment, a method of manufacturing a semiconductor device 20B of which structure is shown in FIG. 4C will be described with reference to FIGS. 9A to 9C. The manufacturing method of this embodiment is basically the same as that of the above-described second embodiment. A difference is that sidewall insulating films are not formed on inner walls of through holes 24B.

Figure 9A:
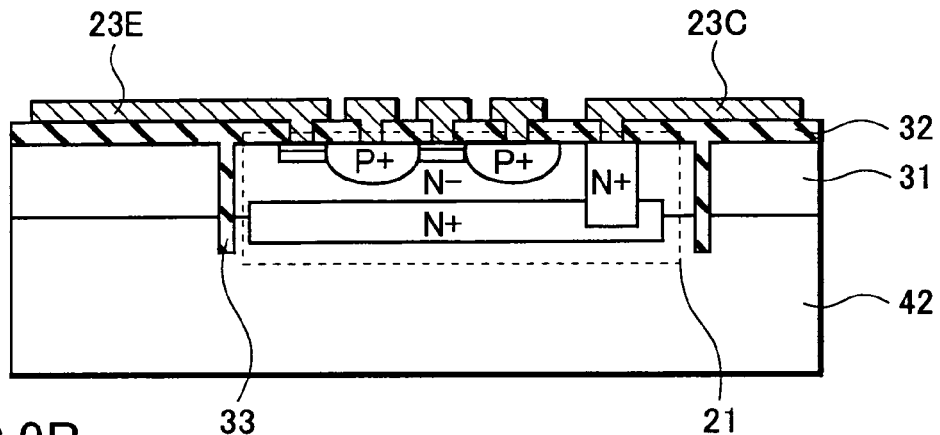
FIGS. 9A to 9C are views showing a method of manufacturing a semiconductor device of a third embodiment of the present invention.

Specifically, first, referring to FIG. 9A, an active region 21 made of, for example, a bipolar transistor is formed. Furthermore, a trench 33 is formed so as to surround the active region 21, whereby a device isolation for the active region 21 is achieved. Other than the trench 33, a PN junction isolation or a LOCOS oxide film may be used to perform an isolation of the active region 21. Moreover, electrodes connected to respective regions constituting the active region 21 are formed on a surface of an oxide film 32. Here, emitter pad electrodes 23E and a collector pad electrode 23C are formed on an upper surface of the oxide film 32 outside the region surrounded by the trench 33.

Figure 9B:
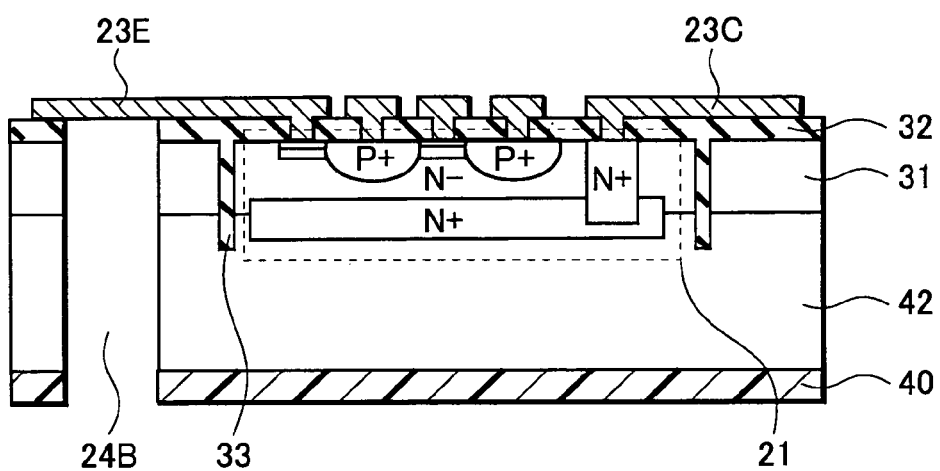

Next, referring to FIG. 9B, the through holes 24B, which penetrate a P-type semiconductor substrate 42 and the like, are formed. A back surface of the P-type semiconductor substrate 42 is covered with a resist 40, which is an etching resistant mask, except for a region where the through holes 24B are to be formed. In this state, the P-type semiconductor substrate 42 is dry-etched from the back surface, and thus the through holes 24B, which penetrate the P-type semiconductor substrate 42, an epitaxial layer 31, and the oxide film 32, are formed. By this step, the back surfaces of the emitter pad electrodes 23E are exposed to the through holes 24B.

Figure 9C:
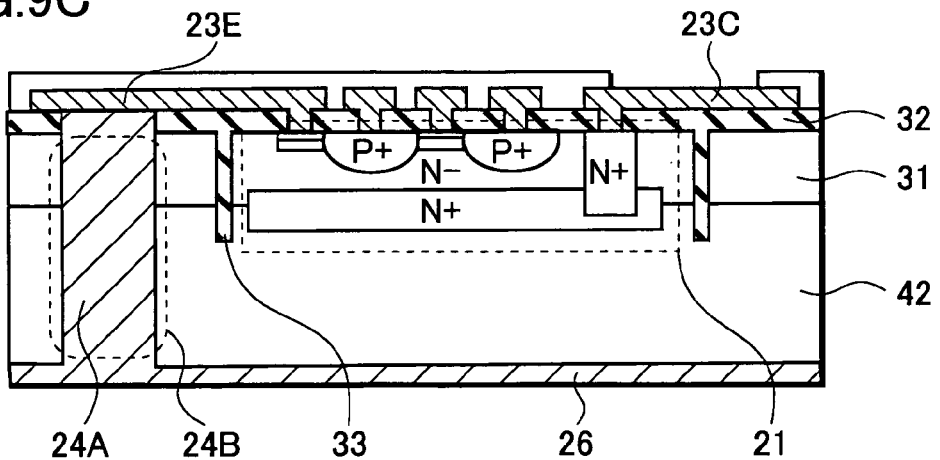

Next, referring to FIG. 9C, feedthrough electrodes 24A are formed in the through holes 24B, and a backside electrode 26 is formed on the back surface of the P-type semiconductor substrate 42. In this embodiment, since the inner walls of the through holes 24B are not covered with insulating films, a conducting material such as a copper constituting the feedthrough electrodes 24A is in direct contact with the inner walls of the through holes 24B. In other words, the feedthrough electrodes 24A are electrically continuous with the P-type semiconductor substrate 42 and the epitaxial layer 31. However, as described above, the device isolation for the active region 21 is achieved by the trench 33, and the feedthrough electrodes 24A are located outside the trench 33. Accordingly, even if the side surfaces of the feedthrough electrodes 24A are not covered with insulating films, the feedthrough electrodes 24A and the active region 21 are not short-circuited.

By the above-described steps, the semiconductor device 20B of which structure is shown in FIG. 4C is manufactured.

According to this embodiment, insulating films made of silicon oxide films or the like are not formed on the inner walls of the through holes 24B. Accordingly, it is possible to omit a step of forming these insulating films, and an yield can be improved.

Specifically, in a case where silicon oxide films are formed on the inner walls of the through holes 24B, the oxide films are formed by a thermal oxidation or a CVD. However, in these methods of forming oxide films, the P-type semiconductor substrate 42 is heated to, for example, approximately 1000° C. Accordingly, since the P-type semiconductor substrate 42 is exposed to an extremely high temperature, thermal stresses act on electrodes formed on the surface of the substrate. Thus, there has been the problem that the emitter pad electrodes 23E and the like are delaminated from the oxide film 32.

In this embodiment, since insulating films are not formed on the inner walls of the through holes 24B, it is possible to reduce a number of steps accompanied by a heating such as the above-described thermal oxidation. Accordingly, since it is possible to prevent a deterioration of the emitter pad electrodes 23E and the like which are caused by the thermal stresses, an yield of a manufacturing step is improved. Furthermore, since the number of steps is reduced, a manufacturing cost can also be reduced.

Fourth Embodiment

In this embodiment, constitutions of a semiconductor device 20C of another embodiment and a circuit device including the same will be described with reference to FIGS. 10A to 12B. In the semiconductor device 20C described here, a plurality of pad electrodes formed on a front surface of a semiconductor substrate 25 are connected through feedthrough electrodes 24A to backside electrodes formed on a back surface of a semiconductor substrate 42. Furthermore, a plurality of backside electrodes are formed on a back surface of the semiconductor substrate 25.

Figure 10A:
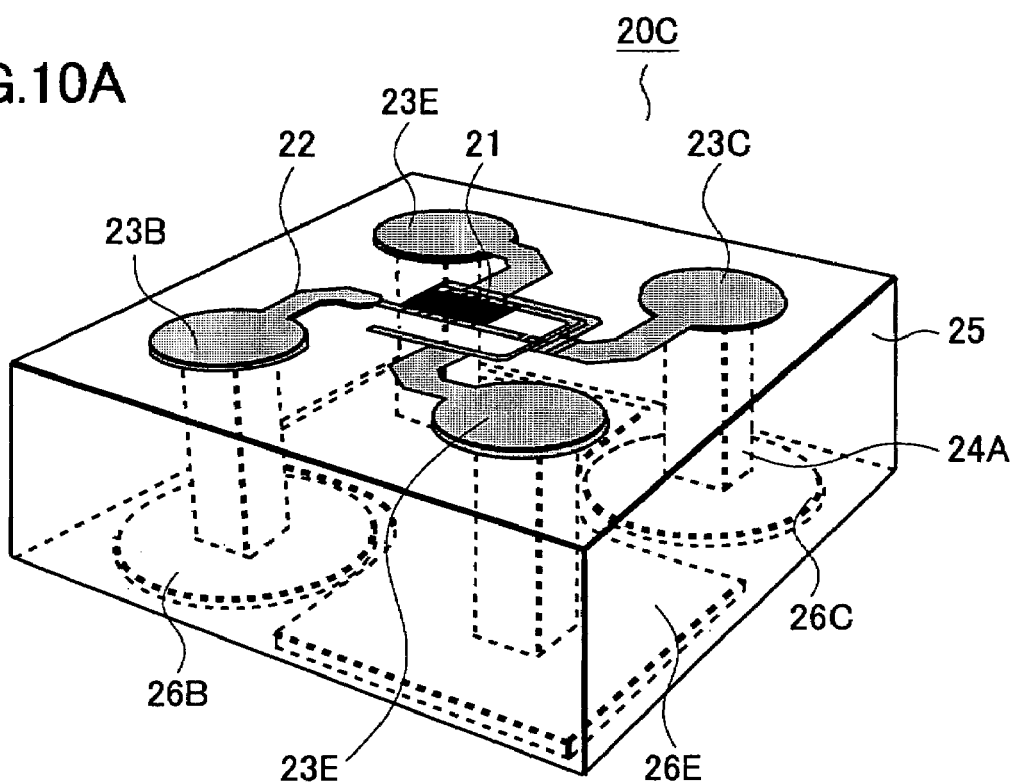
FIGS. 10A and 10B are views showing a semiconductor device of a fourth embodiment of the present invention.
Figure 10B:
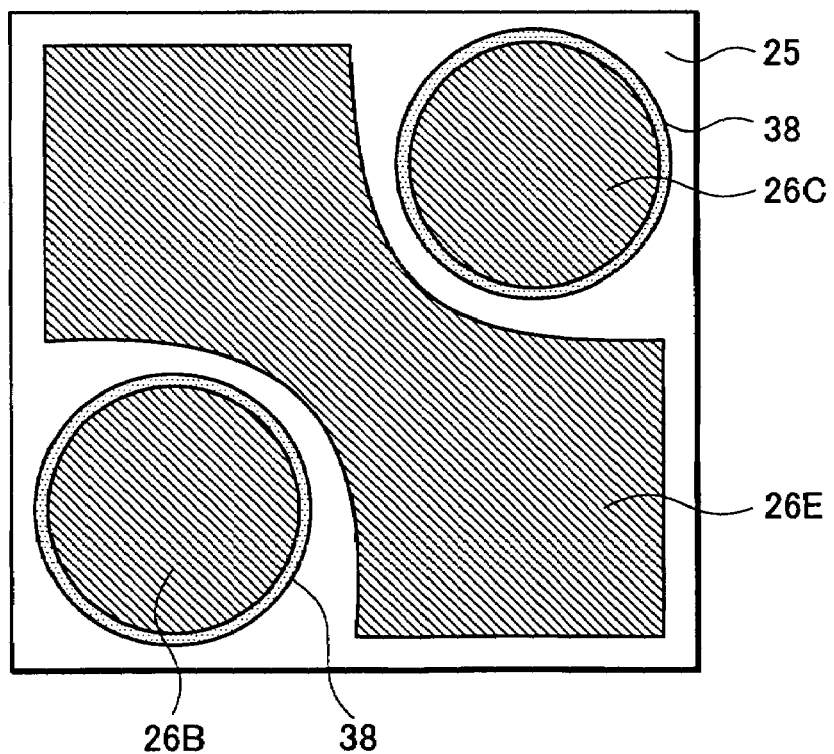

Referring to FIGS. 10A and 10B, the constitution of the semiconductor device 20C will be described. FIG. 10A is a perspective view of the semiconductor device 20C, and FIG. 10B is a plan view of the semiconductor device 20C as seen from a backside.

Referring to FIG. 10A, the basic constitution of the semiconductor device 20C is the same as that of a semiconductor device 20A shown in FIGS. 3A and 3B. A difference is that each pad electrode formed on the front surface of the semiconductor substrate 25 is connected to the electrode on the back surface through the feedthrough electrode 24A.

A collector pad electrode 23C, a base pad electrode 23B, emitter pad electrodes 23E, which are formed on the surface of the semiconductor substrate 25, are connected through the feedthrough electrodes 24A to the backside electrodes formed on the back surface of the semiconductor substrate 25, respectively. This constitution makes it possible to mount the semiconductor substrate 25 without thin metal wires.

Referring to FIG. 10B, a backside collector electrode 26C, a backside base electrode 26B, and a backside emitter electrode 26E are formed on the back surface of the semiconductor substrate 25. The backside collector electrode 26C is connected through the feedthrough electrode 24A to the collector pad electrode 23C formed on the surface of the semiconductor substrate 25. The backside base electrode 26B is connected through the feedthrough electrode 24A to the base pad electrode 23B formed on the surface of the semiconductor substrate 25. The backside emitter electrode 26E is connected through the feedthrough electrodes 24A to the two emitter pad electrodes 23E formed on the surface of the semiconductor substrate 25.

The backside collector electrode 26C and the backside base electrode 26B are placed in vicinities of corners opposite to each other. By separating the backside collector electrode 26C from the backside base electrode 26B in this way, an insulation therebetween can be ensured.

The backside emitter electrode 26E extends continuously from one corner portion to an opposite corner portion on the back surface of the semiconductor substrate 25. In addition, the backside emitter electrode 26E is formed to have a larger area compared with the other backside electrodes. A parasitic inductance can be reduced by forming the backside emitter electrode 26E to have a large area.

In a case where each of backside electrodes and the semiconductor substrate 25 are insulated from each other, an oxide film, a nitride film, or an insulating layer made of an insulating resin is placed on the back surface of the semiconductor substrate 25, and each of backside electrodes is placed on this insulating film. Furthermore, in a case where a solder is attached to each backside electrode, the back surface of the semiconductor substrate 25 is covered with a solder resist, and the backside electrodes are partially exposed.

Figure 11A:
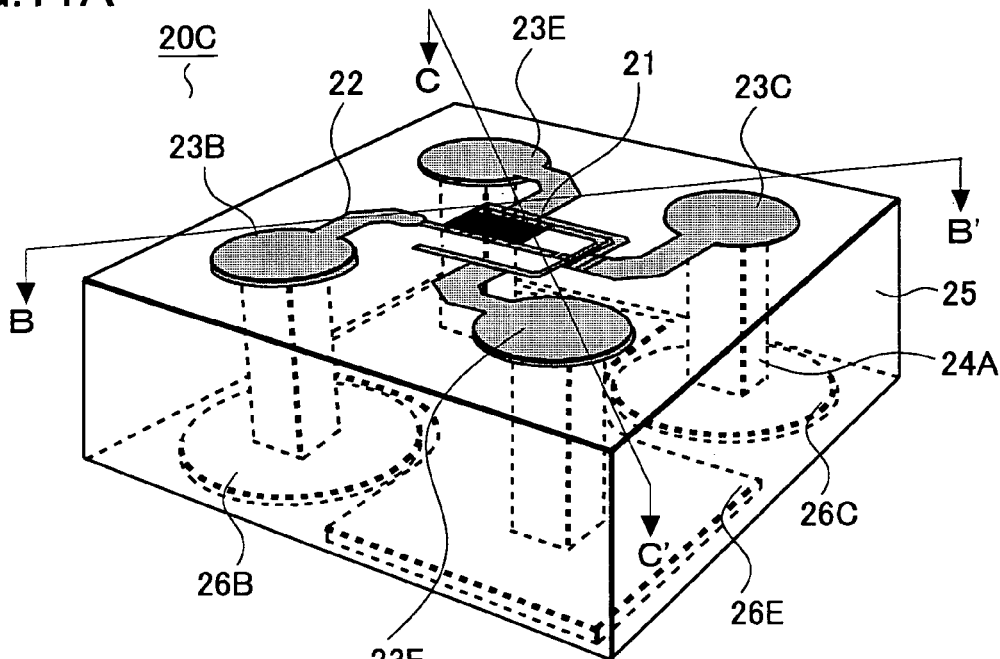
FIGS. 11A to 11C are views showing the semiconductor device of the fourth embodiment of the present invention.
Figure 11B:
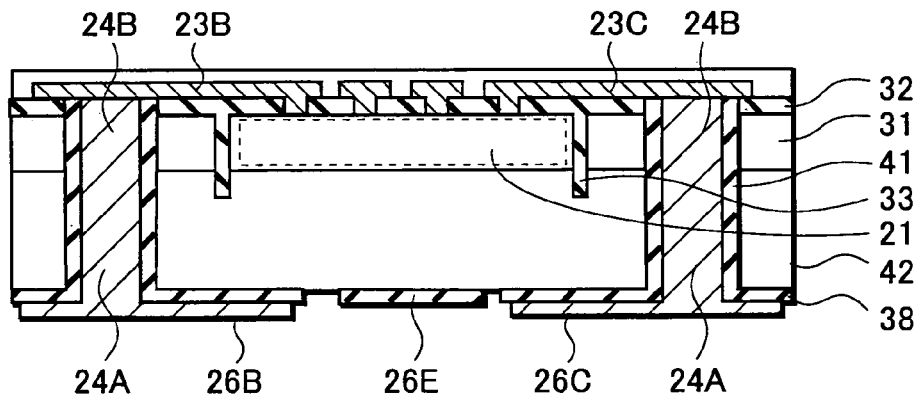
Figure 11C:
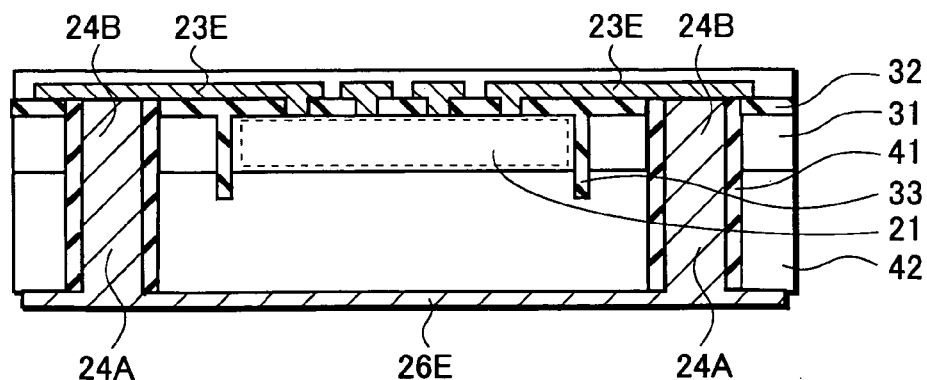

A structure of the semiconductor device 20C will be further described with reference to FIGS. 11A to 11C. FIG. 11A is a perspective view of the semiconductor device 20C. FIG. 11B is a cross-sectional view taken along the line B-B' of FIG. 11A. FIG. 11C is a cross-sectional view taken along the line C-C' of FIG. 11A.

Referring to FIG. 11B, the backside base electrode 26B and the backside collector electrode 26C are insulated from the P-type semiconductor substrate 42 by insulating films 38. Here, the insulating films 38 are made of a film, such as a silicon oxide film, a silicon nitride film, or a resin film, which has insulating properties. Furthermore, the feedthrough electrodes 24A connected to the backside base electrode 26B and the backside collector electrode 26C are insulated from the P-type semiconductor substrate 42 by sidewall insulating films 41. This structure insulates the backside collector electrode 26C and the backside base electrode 26B from other portions of the semiconductor device 20C and prevents shorts between electrodes.

On the other hand, the insulating film 38 is not formed on the back surface of the P-type semiconductor substrate 42 in a region where the backside emitter electrode 26E is formed. That is, the backside emitter electrode 26E is brought into direct contact with the back surface of the P-type semiconductor substrate 42, and they are electrically continuous with each other. Accordingly, when the backside emitter electrode 26E is connected to a grounding potential, the P-type semiconductor substrate 42 is also connected to the grounding potential. Here, the backside emitter electrode 26E may also be insulated from the back surface of the P-type semiconductor substrate 42 by the insulating film 38. That is, all the backside electrodes formed on the back surface of the semiconductor substrate 42 may be insulated from the semiconductor substrate 42 by the insulating films 38.

Although an active region 21 is isolated by a trench 33 here, respective electrodes (emitter, collector, and base electrodes) need to be insulated from each other. Accordingly, in a case where emitter, collector, and base electrodes are provided, at least two electrodes need to be insulated by use of the insulating films 38 and the sidewall insulating films 41 as described above.

Referring to FIG. 11C, the backside emitter electrode 26E is connected through the two feedthrough electrodes 24A to the emitter pad electrodes 23E formed on the upper surface of an oxide film 32. Although the inner walls of the through holes 24A are covered with the sidewall insulating films 41 in this drawing, these sidewall insulating films 41 can also be omitted.

Here, in a case where the semiconductor device 20C is used for a grounded-collector circuit, the backside base electrode 26B and the backside emitter electrode 26E are insulated from the back surface of the semiconductor substrate 25 by the insulating films 38 or the like. Moreover, in this case, the backside collector electrode 26C may be formed directly on the back surface of the semiconductor substrate 25.

Furthermore, in a case where the semiconductor device 20C is used for a grounded-base circuit, the backside collector electrode 26C and the backside emitter electrode 26E are insulated from the back surface of the semiconductor substrate 25 by the insulating films 38. Moreover, in this case, the backside base electrode 26B may be formed directly on the back surface of the semiconductor substrate 25.

Next, constitutions of circuit devices 10D and 10E in which the above-described semiconductor device 20C is incorporated will be described with reference to FIGS. 12A and 12B.

Figure 12A:
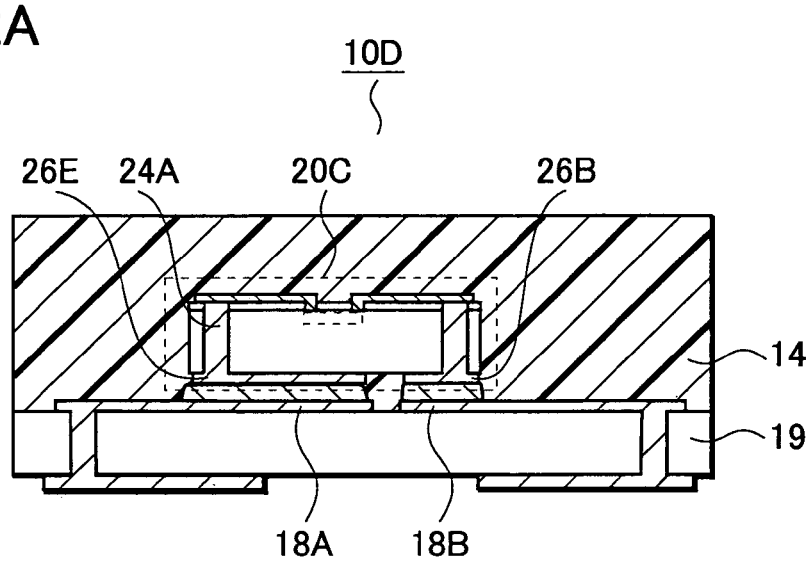
FIGS. 12A and 12B are views showing semiconductor devices of the forth embodiment of the present invention.

Referring to FIG. 12A, the constitution of the circuit device 10D including a circuit substrate 19 will be described. In the circuit device 10D, conductive patterns 18A and 18B are formed on a surface of the circuit substrate 19. Furthermore, a backside emitter electrode 26E located on the back surface of the semiconductor device 20C is connected to the conductive pattern 18A through a solder or the like. Moreover, a backside base electrode 26B located on the back surface of the semiconductor device 20C is connected to a conductive pattern 18B. Furthermore, though not shown, a backside collector electrode is also connected to a conductive pattern formed on the surface of the circuit substrate 19. Except for the above, the constitution of the circuit device 10D of is the same as that of a circuit device 10B shown in FIG. 2A. The circuit device 10D has a constitution in which thin metal wires are omitted.

Figure 12B:
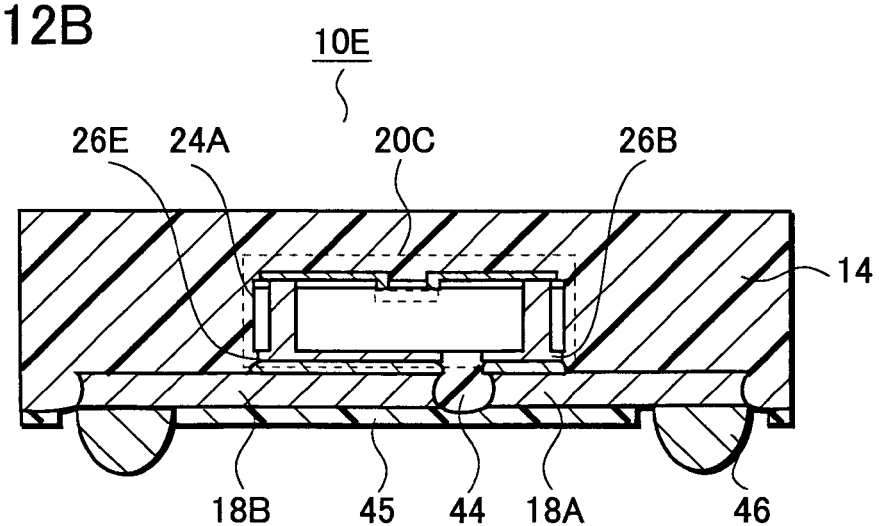
Figure 13:
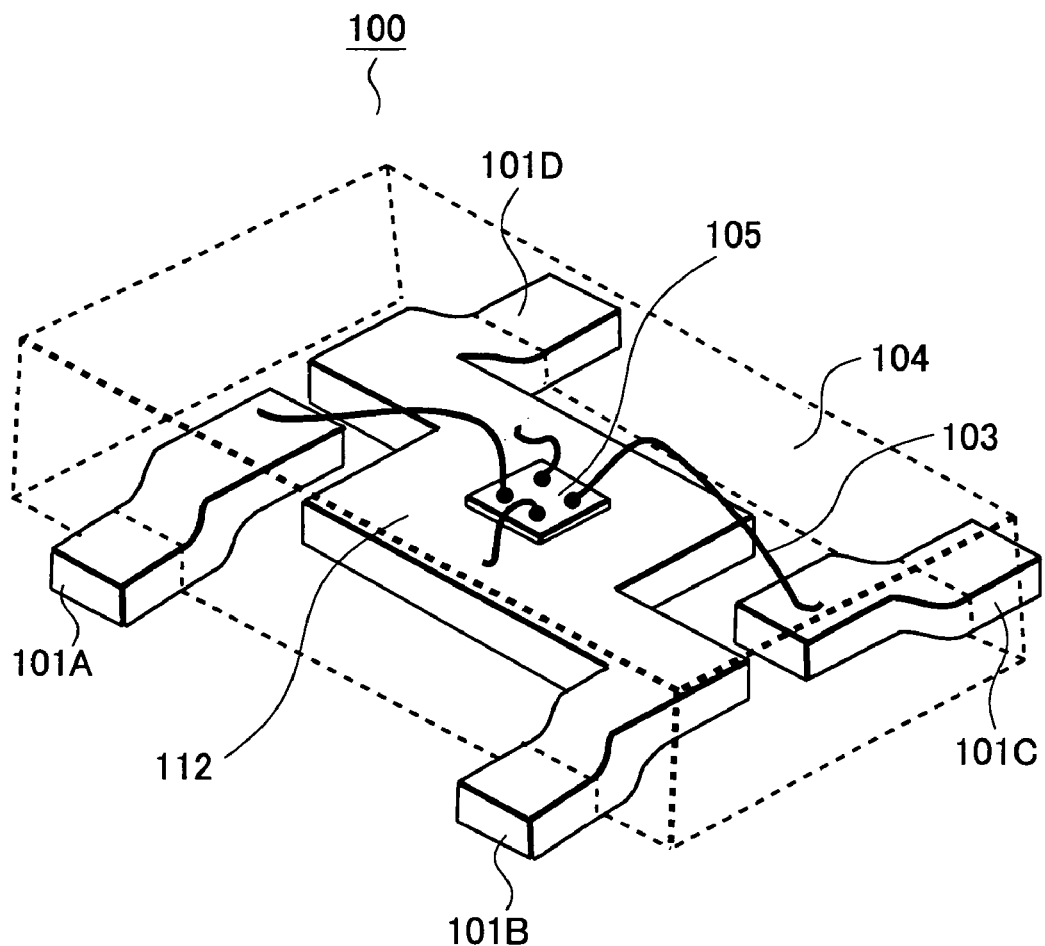
FIG. 13 is a perspective view showing a conventional circuit device.

Referring to FIG. 12B, in the circuit device 10E, the conductive patterns 18A and 18B buried in a sealing resin 14 are connected through a solder to the electrodes formed on the back surface of the semiconductor device 20C. Specifically, the backside base electrode 26B is connected to the conductive pattern 18A, and the backside emitter electrode 26E is connected to the conductive pattern 18B. Except for the above, the constitution of the circuit device 10E is the same as that of a circuit device 10C shown in FIG. 2B.

According to the semiconductor device of the preferred embodiment of the present invention, it is possible to connect the pad electrode to the backside electrode through the feedthrough electrode penetrating the semiconductor substrate, the pad electrode being formed on the surface of the semiconductor substrate, and the backside electrode being formed on the back surface of the semiconductor substrate. Accordingly, it is made possible to connect the pad electrode to an outside through the feedthrough electrode and the backside electrode without using the thin metal wires. For this reason, it is made possible to make a land, on which land the semiconductor device is mounted, as small as the semiconductor device. Consequently, the whole device, in which the semiconductor device is incorporated, is made small.

Furthermore, according to the semiconductor device of the preferred embodiment of the present invention, it is made possible to connect the pad electrode to the outside by use of a feedthrough electrode which has a shorter path and a larger thickness compared to the thin metal wire. For this reason, even in a case of a semiconductor device, which is operated at high frequencies of, for example, not less than 1 GHz, parasitic inductances can be reduced. Accordingly, it is possible to improve high-frequency characteristics.

Furthermore, according to the method of manufacturing the semiconductor device of the preferred embodiment of the present invention, it is possible to form the feedthrough electrode directly inside the through hole penetrating the semiconductor substrate by achieving a device isolation for the active region by means of the isolation region. In other words, it is not required to insulate the inside of the through hole by means of a thermal oxidation method or the like. Accordingly, it is possible to omit a heating step such as the thermal oxidation method for heating the semiconductor substrate to a high temperature, whereby an yield thereof can be improved.

What is claimed is:

1. A semiconductor device, comprising:
    a semiconductor substrate including a front surface, a back surface and four lateral faces, which connect a periphery of the front surface and a periphery of the back surface;
    a diffusion region in the semiconductor substrate;
    a pad electrode on the front surface of the semiconductor substrate, which is electrically connected to the diffusion region;
    a backside electrode on the back surface of the semiconductor substrate;
    a through-hole penetrating through the semiconductor substrate and located under the pad electrode;
    a feedthrough electrode, which electrically connects the pad electrode and the backside electrode through the semiconductor substrate and which is formed of a conductive material covering an inner wall of the through-hole or filled in the through-hole, and wherein
    the diffusion region is surrounded by an isolation region;
    the pad electrode is outside of the isolation region; and
    the diffusion region and the pad electrode are connected through a wiring.

2. The semiconductor device according to claim 1, wherein the diffusion region is a first region for passing through principal current, a second region for passing through principal current, or a control region for passing through a control signal.

3. The semiconductor device according to claim 1, including two feedthrough electrodes that correspond to two pad electrodes and the two feedthrough electrodes are connected to the backside electrode.

4. The semiconductor device according to claim 1, wherein the diffusion region is connected through a plurality of pad electrodes and feedthrough electrodes to the backside electrode, which is grounded.

5. The semiconductor device according to claim 1, wherein the diffusion region is a diffusion region of a transistor, a diode, an IC, or a LSI.

* * * * *